United States Patent
Gu

(10) Patent No.: US 12,040,797 B2
(45) Date of Patent: *Jul. 16, 2024

(54) COUNTER CIRCUIT

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/156,384

(22) Filed: Jan. 18, 2023

(65) Prior Publication Data
US 2023/0378959 A1 Nov. 23, 2023

Related U.S. Application Data

(63) Continuation of application No. PCT/CN2022/096079, filed on May 30, 2022.

(30) Foreign Application Priority Data

May 23, 2022 (CN) .......................... 202210563545.8

(51) Int. Cl.
*H03K 23/00* (2006.01)
*H03K 17/687* (2006.01)
(Continued)

(52) U.S. Cl.
CPC ......... *H03K 21/08* (2013.01); *H03K 17/6872* (2013.01); *H03K 19/20* (2013.01); *H03K 23/40* (2013.01)

(58) Field of Classification Search
CPC ........ H03K 23/00; H03K 23/58; H03K 23/42; H03K 23/425; H03K 23/40; H03K 19/20; H03K 17/6872
See application file for complete search history.

(56) References Cited

U.S. PATENT DOCUMENTS 5,559,844 A * 9/1996 Lee .......................... H03K 23/50
377/81
7,419,275 B2 * 9/2008 Huang ................... B43K 25/00
362/205
(Continued)

FOREIGN PATENT DOCUMENTS

CN       101060326 A     10/2007
CN       105468335 A      4/2016
(Continued)

OTHER PUBLICATIONS

Jedec Solid State Technology Association, "Jedec Standard DDR5 SDRAM JESD79-5" Jul. 2020.

*Primary Examiner* — Tuan T Lam
(74) *Attorney, Agent, or Firm* — Syncoda LLC; Feng Ma

(57) ABSTRACT

A counter circuit includes multiple stages of counting circuits corresponding to binary bits, each stage being configured to: obtain a carry signal and a this-time bit value according to an addend signal and a bit value currently output by the stage, output the carry signal to a next-stage counting circuit, latch the this-time bit value in response to a first clock and output same to an output terminal of the stage of counting circuit in response to a second clock. An output of the counter circuit is composed of bit values output by the multiple stages and is a binary representation of a counting result. An addend signal of a start-stage counting circuit is a high-level signal and an addend signal of a non-start-stage counting circuit is a carry signal output by an immediately previous stage. The first and second clocks are obtained based on division of a system clock.

15 Claims, 16 Drawing Sheets

(51) Int. Cl.
*H03K 19/20* (2006.01)
*H03K 21/08* (2006.01)
*H03K 23/40* (2006.01)

(56) References Cited

U.S. PATENT DOCUMENTS

| | | |
|---|---|---|
| 10,103,742 B1 | 10/2018 | Guo |
| 2002/0126560 A1 | 9/2002 | Cowles |
| 2010/0046693 A1* | 2/2010 | Ellersick ............. H03K 23/667 377/47 |
| 2015/0207511 A1* | 7/2015 | Dahan .................. H03K 23/542 377/34 |
| 2016/0173106 A1* | 6/2016 | Gupta .................... H03K 21/38 377/118 |
| 2020/0134268 A1 | 4/2020 | Frantz |
| 2023/0377615 A1* | 11/2023 | Gu ........................ G11C 7/222 |

FOREIGN PATENT DOCUMENTS

| | | |
|---|---|---|
| CN | 106330169 A | 1/2017 |
| CN | 110199482 A | 9/2019 |
| CN | 112820225 A | 5/2021 |
| CN | 113114190 A | 7/2021 |
| SU | 879494 A1 | 11/1981 |
| WO | 2016019788 A1 | 2/2016 |

\* cited by examiner (1)

COUNTER CIRCUIT

CROSS-REFERENCE TO RELATED APPLICATIONS

This is a continuation of International Application No. PCT/CN2022/096079 filed on May 30, 2022, which claims priority to Chinese Patent Application No. 202210563545.8 filed on May 23, 2022. The disclosures of the above-referenced applications are hereby incorporated by reference in their entirety.

BACKGROUND

With the development of memory technologies, memories are widely used in various fields, for example, a Dynamic Random Access Memory (DRAM) is widely used.

In practical applications, the memory usually needs to have a counting function to support the operation of the memory. For example, the counting function can be used not only for counting clock pulses, but also for frequency division, timing, generation of beat pulses and pulse sequences, and performing digital operations. Therefore, a counter circuit needs to be provided to realize the counting function.

SUMMARY

The present disclosure relates to memory technologies, particularly to a counter circuit.

According to some embodiments, a first aspect of the present disclosure provides a counter circuit, including: multiple stages of counting circuits corresponding to binary bits; each stage of counting circuit is configured to: obtain a carry signal and a this-time bit value according to an addend signal and a bit value currently output by the stage of counting circuit, output the carry signal to a next-stage counting circuit, latch the this-time bit value in response to a first clock, and output the this-time bit value to an output terminal of the stage of counting circuit in response to a second clock; wherein an output of the counter circuit is composed of bit values output by the multiple stages of counting circuits, and the output is a binary representation of a counting result; an addend signal of a start-stage counting circuit is a high-level signal, and an addend signal of a non-start-stage counting circuit is a carry signal output by an immediately previous stage of counting circuit; the first clock and the second clock are obtained based on division of a system clock.

BRIEF DESCRIPTION OF THE DRAWINGS

The accompanying drawings, which are incorporated in and constitute a part of the description, illustrate embodiments consistent with the present application and together with the description serve to explain the principles of the embodiments of the present disclosure.

Figure 1:
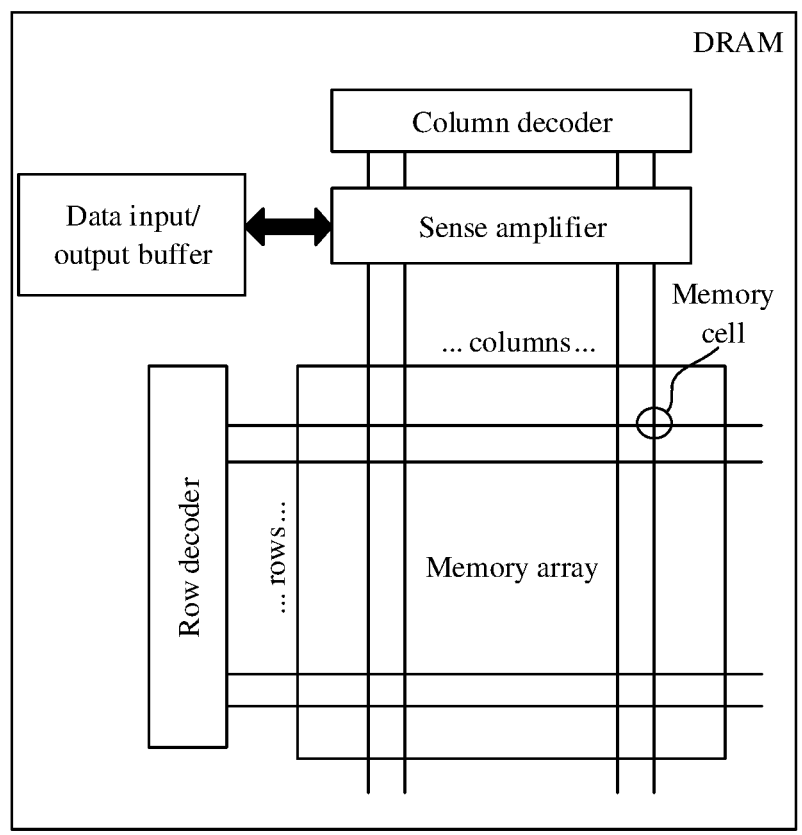
FIG. 1 illustrates a schematic diagram of architecture of a memory according to an embodiment of the present disclosure.

Specific embodiments of the present disclosure have been shown by the above drawings, and will be described in more detail later. These drawings and descriptions are not intended to limit the scope of the concept of the present disclosure, but to illustrate the concepts of the present disclosure for those skilled in the art by reference to specific embodiments.

DETAILED DESCRIPTION

Exemplary embodiments will be described in detail herein, examples of which are illustrated in the accompanying drawings. When the following description relates to the drawings, the same numerals in different drawings represent the same or similar elements unless otherwise indicated. The implementations described in the exemplary embodiments below are not intended to represent all implementations consistent with the present disclosure. Rather, they are merely examples of apparatuses and methods consistent with some aspects of the present disclosure as detailed in the appended claims.

The terms "comprise", "include" and "have" in the present disclosure are intended to be inclusive in an open manner and to mean that additional elements/components or like may be present in addition to the listed elements/components or like. The terms such as "first" and "second" are used only as labels or distinctions, and are not intended to limit the order or number of objects. Furthermore, various elements and areas in the drawings are shown only schematically and therefore the present disclosure is not limited to the dimensions or distances shown in the drawings.

The technical solution of the present disclosure will be described in detail with specific embodiments below. The following specific embodiments may be combined with one another, and the same or similar concepts or processes may not be repeated in some embodiments. Embodiments of the present disclosure will be described below in conjunction with the accompanying drawings.

FIG. 1 illustrates a schematic diagram of architecture of a memory according to an embodiment of the present disclosure. As illustrated in FIG. 1, taking a DRAM as an example, a data input/output buffer, a row decoder, a column decoder, a sense amplifier, and a memory array are included. The memory array is mainly composed of word lines, bit lines and memory cells. The word lines in the memory array extend in the row direction, the bit lines in the memory array extend in the column direction, and memory cells of the memory array are provided at the intersections of the word lines and the bit lines.

Figure 2:
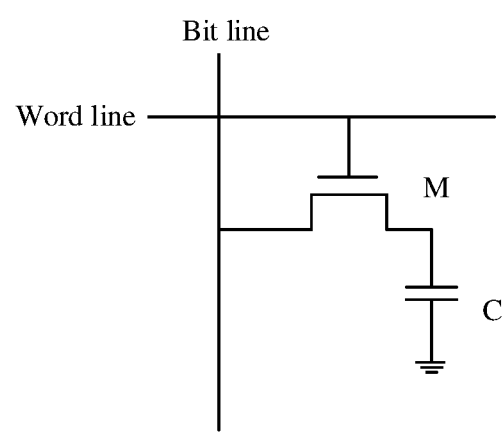
FIG. 2 illustrates a schematic structural diagram of a memory cell according to an embodiment of the present disclosure.

Each memory cell is used to store one bit of data. As illustrated in FIG. 2, FIG. 2 illustrates a schematic structural diagram of a memory cell according to an embodiment of the present disclosure. The memory cell is mainly composed of a transistor M and a capacitor C. The capacitor is used to store data, and the transistor is turned off or on according to the state of the word line.

A certain memory cell can be activated by controlling a row and a column, to achieve the access to the memory cell. Taking a reading scenario as an example, when the data in the memory cell needs to be read, the word line of the row where the memory cell is located can be selected by the row decoder; accordingly, the transistor M in the drawing is turned on, and the state on the capacitor C at this time can be perceived by sensing and amplifying the bit line signal. For example, if the data stored in the memory cell is 1, the transistor M will read 1 from the bit line of the memory cell after being turned on, and vice versa. In addition, taking a writing scenario as an example: when the data needs to be written to a certain memory cell, such as writing 1 to the memory cell, the word line of the row where the memory cell is located can be selected by the row decoder; accordingly, the transistor M in the drawing is turned on, and the capacitor C is charged by setting a logic level of the bit line to be 1, that is, 1 is written to the memory cell. On the contrary, if 0 is to be written, the logic level of the bit line is 0, so that the capacitor C is discharged, that is, 0 is written to the memory cell.

In practical applications, in order to support the operation of the memory, a counting function needs to be used. For example, as specified in the double data rate 5 (DDR5) Joint Electron Device Engineering Council (JEDEC) standard, in order to improve the ability of DDR5 DRAM to withstand Row Hammer, a Rolling Accumulated ACT (RAA) counter for Refresh Management (RFM) is provided to detect and calculate the number of activation commands (ACT CMD) received by a memory in real time.

Some aspects of embodiments of the present disclosure relate to the above considerations. An exemplary description of the scheme is given below in connection with some embodiments of the present disclosure.

Embodiment 1

Figure 3:
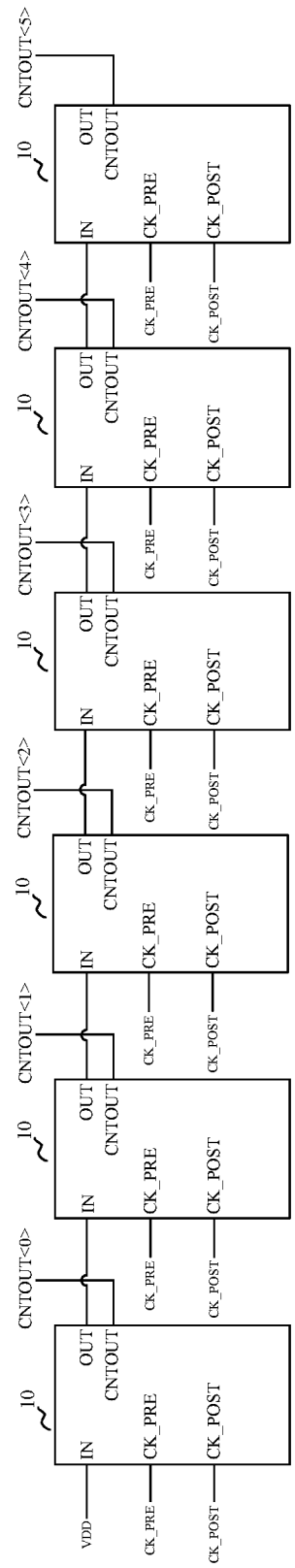
FIG. 3 illustrates a schematic structural diagram of a counter circuit according to an embodiment of the present disclosure.

FIG. 3 illustrates a schematic structural diagram of a counter circuit according to an embodiment of the present disclosure. As illustrated in FIG. 3, the counter circuit includes multiple stages of counting circuits 10 corresponding to binary bits.

Each stage of counting circuit 10 is configured to: obtain a carry signal and a this-time bit value according to an addend signal and a bit value that is currently output by a current stage; output the carry signal to a next-stage counting circuit 10, latch the this-time bit value in response to a first clock CK_PRE, and output the this-time bit value to an output terminal of the stage of counting circuit in response to a second clock CK_POST. Bit values output by the multiple stages of counting circuits 10 compose an output of the counter circuit, and the output is a binary representation of a counting result.

An addend signal of a start-stage counting circuit 10 is a high-level signal, and an addend signal of a non-start-stage counting circuit 10 is a carry signal output by an immediately previous stage of counting circuit 10. The first clock CK_PRE and the second clock CK_POST are obtained based on division of a system clock.

In practical applications, the counter circuit provided in the embodiment can be applied to various memories, including but not limited to a Double Data Rate DRAM (a DDR for short) and the like as an example.

In conjunction with FIG. 3, the counting result being a six-bit binary number is taken as an example. It can be understood that, in practical applications, the number or the number of stages of counting circuits in the counter circuit can be determined according to counting scenarios and requirements. For example, the counting result may be an eight-bit counting result, and accordingly, the counter circuit may include eight stages of counting circuits. The number or the number of stages of counting circuits is not limited in the drawing. Combined with the example of the drawing, CNTOUT<5:0> represents the binary representation of the counting result output by the counter circuit, i.e. the CNTOUT<0 . . . > output by each of the counting circuits is one bit of the binary representation of the counting result. For instance, a result CNTOUT<0> outputted by a start-stage counting circuit 10 is a lowest bit of the binary representation of the counting result, a result CNTOUT<1> outputted by a second-stage counting circuit 10 is the penultimate bit of the binary representation of the counting result, and so on, and a result CNTOUT<5> outputted by a last-stage counting circuit 10 is a highest bit of the binary representation of the counting result. For example, assuming that an combined output result of CNTOUT<5:0> is 001010, a decimal representation of the counting result of the counter circuit is 10.

Figure 4:
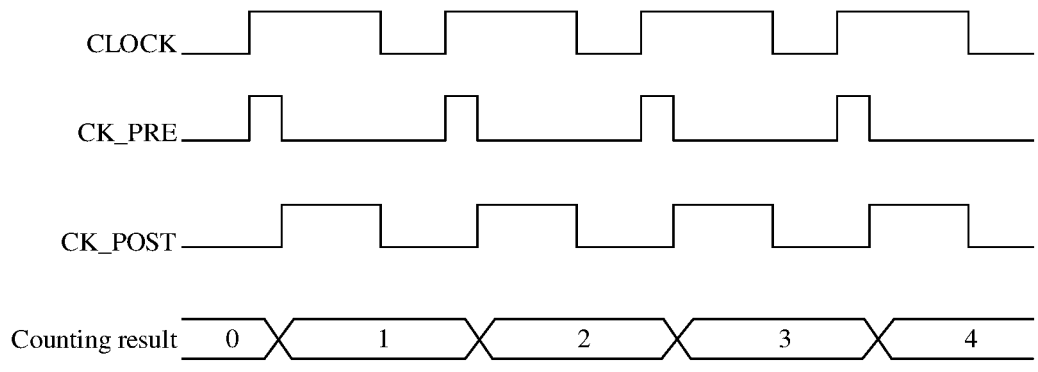
FIG. 4 is an exemplary signal timing diagram.

For better understanding of the scheme of the present embodiment, FIG. 4 illustrates a schematic signal timing diagram. In the drawing, CLOCK is an example of a timing waveform of a system clock, CK_PRE is an example of a timing waveform of a first clock, CK_POST is an example of a timing waveform of a second clock, and CNTOUT<5:0> is an example of timing of a counting result. Combined with the illustration of FIG. 4, the working process of the counter circuit is introduced with examples as the following.

The bit value of each stage of counting circuit refers to a low-bit data of the result output by the counting circuit. The carry signal of each stage of counting circuit refers to a high-bit data of the result output by the counting circuit, and the high bit data is transmitted to a next-stage counting circuit so that the next-stage counting circuit can obtain the carry signal and a carry value of the next-stage counting circuit by calculation according to the received carry signal and an addend signal. It can be understood that since the counting can be carried out in real time, the input and output of each stage of counting circuit are dynamically updated at different moments. Therefore, in the embodiment, the bit value output by the counting circuit at a current moment or in a current counting is also called as a this-time bit value, and the term "this-time" in other places also has similar meanings. In the embodiment, the addend signal depends on the stage of the counting circuit. As an example, for the start-stage counting circuit, the addend signal is a high-level signal and has the logic level state of 1, thus realizing the counting mode of accumulatively adding 1. In practical applications, the addend signal of the start-stage counting circuit can be provided by VDD, as shown in FIG. 4, the addend signal VDD is input into the counter circuit. As an example, the addend signal VDD in the drawing is input into the IN port of the start-stage counting circuit of the counter circuit. The addend signal of the non-start-stage counting circuit is the carry signal output by the immediately previous stage of counting circuit, and the IN port of each of the remaining counting circuits is connected to a carry output terminal OUT of the immediately previous stage of counting circuit thereof correspondingly. The carry output terminal OUT is configured to output a this-time carry signal of the present counting circuit.

Figure 5:
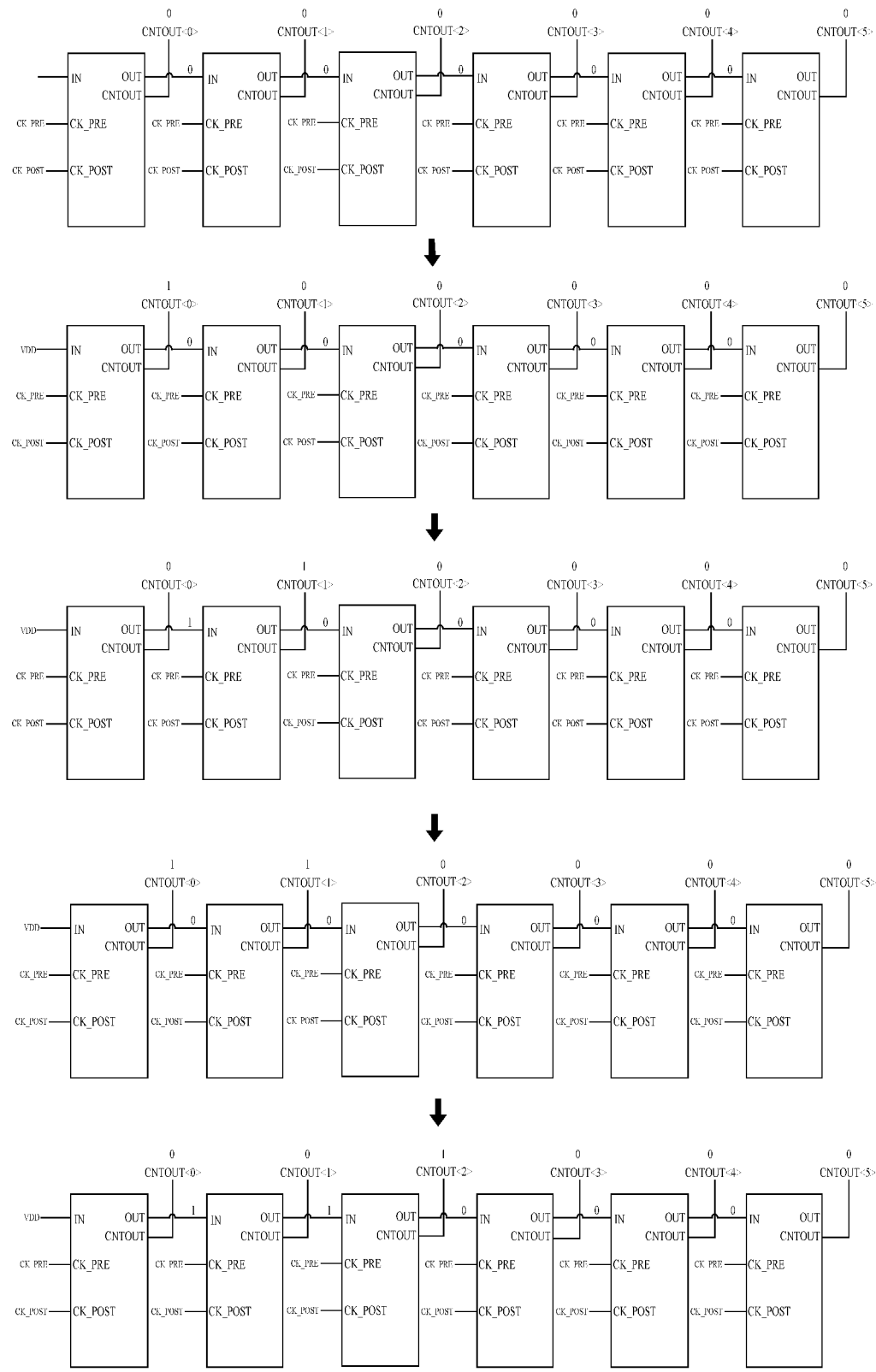
FIG. 5 illustrates a schematic diagram of port states of a counter circuit during counting.

FIG. 5 illustrates a schematic diagram of port states of a counter circuit during counting. Combined with FIG. 4 and FIG. 5, for example, it is assumed that in an initial state, the bit value currently output by the each stage of counting circuit is set to be 0. When counting is needed, the addend signal is input into the start-stage counting circuit of the counter circuit, and the start-stage counting circuit obtains the this-time bit value of 1 and the carry signal of 0 by calculation according to the bit value, i.e., 0, currently output by the present stage of counting circuit and the addend signal of 1. The carry signal is input into the IN port of the second-stage counting circuit through a carry output terminal OUT of the start-stage counting circuit. During the process, the start-stage counting circuit latches the this-time bit value of 1 in response to the first clock CK_PRE. That is, when the first clock arrives (combined with the example in FIG. 4, i.e., when a first rising edge of CK_PRE arrives), the start-stage counting circuit latches the this-time bit value of 1, but does not output the this-time bit value to the second-stage counting circuit until the end of the first clock CK_PRE. When the second clock CK_POST arrives, the this-time bit value of 1 is output to the output terminal CNTOUT<0> of the start-stage counting circuit, that is, the CNTOUT<0> of the counting result of this time is 1.

For the second-stage counting circuit, the bit value currently output by the second-stage counting circuit has not been updated by the counting, and is thus still the initial value of 0, and the carry signal received from the immediately previous stage of counting circuit (i.e., the start-stage counting circuit) is 0. The second-stage counting circuit can obtain the carry signal of the present stage of 0, and the this-time bit value of 0 as well by calculation. Similarly, the carry signal of the second-stage counting circuit is input into the IN terminal of the third-stage counting circuit through a carry output terminal OUT of the second-stage counting circuit. During the same process, the second-stage counting circuit latches the this-time bit value of 0 in response to the first clock CK_PRE, but does not output the this-time bit value to the third-stage counting circuit until the end of the first clock CK_PRE. When the second clock CK_POST arrives, the this-time bit value of 0 is output to the output terminal CNTOUT<1> of the second-stage counting circuit; that is, the CNTOUT<1> of the counting result of this time is 0.

For each of the remaining stages of counting circuits after the second-stage counting circuit, the working principle is similar to that of the second-stage counting circuit, and the CNTOUT<2:5> output by each of the remaining stages of counting circuits is 0. It can be seen that, after a system clock CLOCK, the binary representation of the counting result CNTOUT<5:0> is 000001; that is, the decimal representation of the counting result is 1.

After that, the counter circuit continues to work. Examples are as follows: after one time of counting, for the start-stage counting circuit, the currently latched bit value is 1 and the carry signal is 0. For each of the remaining stages of counting circuits, the currently latched bit value is 0 and the carry signal is 0. Therefore, based on the currently latched bit value of 1 and the addend signal of 1, the start-stage counting circuit calculates the calculation result to be 10. That is, the this-time bit value of the start-stage counting circuit is 0 and the carry signal is 1. The start-stage counting circuit inputs the carry signal of 1 into the IN terminal of the second-stage counting circuit through the carry output terminal OUT. In response to the first clock CK_PRE, the this-time bit value of 0 is latched until the end of the first clock CK_PRE. When the second clock CK_POST arrives, the this-time bit value of 0 is output to the output terminal CNTOUT<0> of the start-stage counting circuit.

Based on the carry signal of 1 received at this time and the currently latched bit value of 0, the second-stage counting circuit obtains a calculation result of 01 at this time. That is, the this-time bit value of the second-stage counting circuit is 1 and the carry signal is 0. The second-stage counting circuit inputs the carry signal of 0 into the third-stage counting circuit. In response to the first clock CK_PRE, the this-time bit value of 1 is latched until the end of the first clock CK_PRE. When the second clock CK_POST arrives, the this-time bit value of 1 is output to the output terminal CNTOUT<1> of the second-stage counting circuit. Correspondingly, based on the carry signal of 0 received at this time and the currently latched bit value of 0, the third-stage counting circuit obtains a calculation result of 00 at this time. In such a way, after a second system clock, the CNTOUT<2:5> output by each of the remaining stages of counting circuits is 0. That is, the counting result CNTOUT<5:0> of the counter circuit at this time is 000010, and the decimal representation is 2.

Similarly, the counter circuit continues to work: based on the currently latched bit value of 0 and the addend signal of 1, the start-stage counting circuit calculates the this-time bit value of the start-stage counting circuit to be 1 and the carry signal to be 0. The start-stage counting circuit transmits the carry signal of 0 to the second-stage counting circuit. In response to the first clock CK_PRE, the this-time bit value of 1 is latched until the second clock CK_POST arrives so that CNTOUT<0> outputs the this-time bit value of 1. Based on the carry signal of 0 received at this time and the currently latched bit value of 1, the second-stage counting circuit obtains the this-time bit value of the second-stage counting circuit to be 1 and the carry signal to be 0. When the second clock CK_POST arrives, the CNTOUT<1> of the second-stage counting circuit outputs the this-time bit value 1. In such a way, after a third system clock, the CNTOUT<2:5> output by each of the remaining stages of counting circuits is 0. That is, the counting result CNTOUT<5:0> of the counter circuit at this time is 000011, and the decimal representation is 3.

Subsequently, based on the currently latched bit value of 1 and the addend signal of 1, the start-stage counting circuit calculates the this-time bit value of the start-stage counting circuit to be 0 and the carry signal to be 1. The start-stage counting circuit transmits the carry signal of 1 to the second-stage counting circuit. In response to the first clock CK_PRE, the this-time bit value of 0 is latched until the second clock CK_POST arrives so that CNTOUT<0> outputs the this-time bit value of 0. Based on the carry signal 1 received at this time and the currently latched bit value of 1, the second-stage counting circuit obtains the this-time bit value of the second-stage counting circuit to be 0 and the carry signal to be 1. When the second clock CK_POST arrives, the CNTOUT<1> of the second-stage counting circuit outputs the this-time bit value of 0. Based on the carry signal of 1 received at this time and the currently latched bit value of 0, the third-stage counting circuit obtains the this-time bit value of the third-stage counting circuit to be 1 and the carry signal to be 0. When the second clock CK_POST arrives, CNTOUT<2> outputs the this-time bit value of 1. In such a way, after a fourth system clock, the CNTOUT<3:5> output by each of the remaining stages of counting circuits is 0. That is, the counting result CNTOUT<5:0> of the counter circuit at this time is 000100, and the decimal representation is 4. Subsequently, by implementing the similar principle, the counting results are accumulatively incremented by 1 with each arrival of the system clock.

According to the counter circuit in the embodiment, effective and reliable counting can be achieved. Compared with the counting realized by the use of flip-flops in some implementations, the counter circuit provided by the embodiment does not need to rely on the multi-stage flip-flop structures, the structures can be simplified, and it is convenient to flexibly design the counter circuit with more abundant functions.

Figure 6:
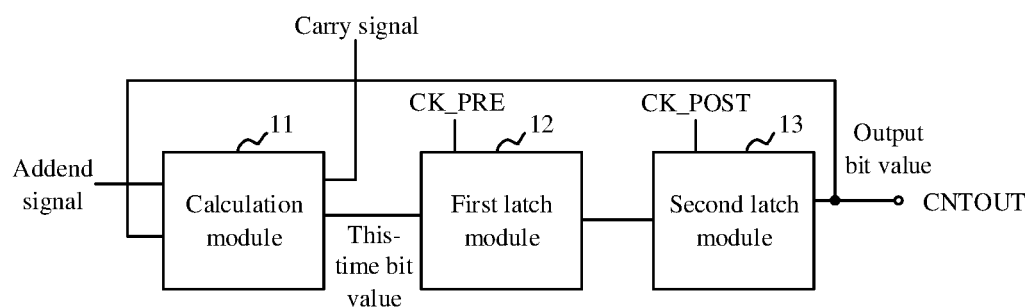
FIG. 6 illustrates a first schematic structural diagram of a counting circuit according to an embodiment of the present disclosure.

In order to implement the aforementioned counting circuit, in some embodiments, as shown in FIG. 6, FIG. 6 illustrates a schematic structural diagram of a counting circuit according to an embodiment of the present disclosure. Each stage of counting circuit 10 includes a calculation circuit 11, a first latch circuit 12 and a second latch circuit 13.

The calculation circuit 11 is connected to the second latch circuit 13 and a calculation circuit of the next-stage counting circuit, and is configured to: obtain the carry signal and the this-time bit value according to the addend signal and the bit value that is currently output by the second latch circuit 13, and output the carry signal to the calculation circuit of the next-stage counting circuit.

The first latch circuit 12 is connected to the calculation circuit 11 and the second latch circuit 13, and is configured to transmit the this-time bit value to the second latch circuit 13 in response to arrival of the first clock CK_PRE, and latch the this-time bit value in response to end of the first clock CK_PRE.

The second latch circuit 13 is configured to output the this-time bit value to an output terminal CNTOUT of the stage of counting circuit 10 in response to arrival of the second clock CK_POST, and latch the this-time bit value in response to end of the second clock CK_POST.

It should be noted that an example of the structure of only a single counting circuit is shown in FIG. 6, and the structures of other counting circuits may be the same as or similar to that of the counting circuit in this example. The difference is that the addend signal connected to the IN port of the start-stage counting circuit is a high-level signal, such as VDD signal; and the addend signal connected to the IN port of each of the remaining stages of counting circuits is the carry signal output by the carry output terminal OUT of the immediately previous stage of counting circuit.

Specifically, for each stage of counting circuit 10, the calculation circuit 11 obtains the this-time bit value and the carry signal of the present stage of counting circuit 10, by calculation according to the bit value currently latched by the second latch circuit 13 of the present stage of counting circuit 10 and the signal currently received by IN port (for instance, the VDD signal or the carry signal output by the immediately previous stage of counting circuit, which depends on the stage number of the counting circuit). The process can be executed directly after the last accumulative counting without waiting for the first clock CK_PRE or the second clock CK_POSTT. Similarly, the calculation circuit 11 directly transmits the carry signal obtained by this calculation to the calculation circuit of the next-stage counting circuit, and transmits the this-time bit value obtained by this calculation to the first latch circuit 12. The first latch circuit 12 transmits the this-time bit value to the second latch circuit 13 in response to the first clock CK_PRE. When the first clock CK_PRE ends and the second clock CK_POST arrives, the first latch circuit 12 latches the this-time bit value, and the second latch circuit 13 transmits the this-time bit value to the output terminal CNTOUT of the present stage of counting circuit 10. When the second clock CK_POST ends, the second latch circuit 13 latches the this-time bit value, directly takes the bit value as the bit value currently output by the present stage of counting circuit 10, and transmits the bit value to the calculation circuit 11. Thus, according to the bit value currently output by the counting circuit 10 and the signal currently received by the IN port after the present time of counting, the calculation circuit 11 makes calculation again to obtain the this-time bit value and the carry signal of next time of counting. Briefly, after each time of counting, the state of the next counting is prepared, so that the result can be directly latched and output when the next system clock arrives, thereby improving the timeliness and efficiency of counting.

Figure 7:
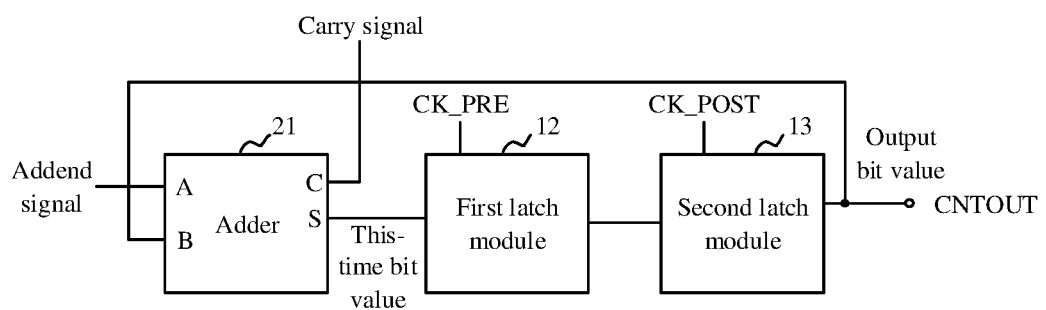
FIG. 7 illustrates a second schematic structural diagram of a counting circuit according to an embodiment of the present disclosure.

The calculation circuit 11 is configured to perform an addition calculation of the this-time bit value and the carry signal. In some embodiments, as illustrated in FIG. 7, FIG. 7 illustrates a schematic structural diagram of a counting circuit according to an embodiment of the present disclosure. On the basis of the foregoing, the calculation circuit 11 includes an adder 21.

A first input terminal A of the adder 21 is connected to the addend signal, and a second input terminal B of the adder 21 is connected to an output terminal of the second latch circuit 13.

A carry terminal C of the adder 21 is connected to the next-stage counting circuit, and a sum terminal S of the adder 21 is connected to the first latch circuit 11 and is configured to output the this-time bit value.

Specifically, the carry terminal of the adder is the carry output terminal of the counting circuit. In practical applications, the carry terminal of the adder can be connected to the carry output terminal OUT of the counting circuit to output the carry signal through the carry output terminal OUT.

In the embodiment, the calculation circuit includes an adder to implement accurate and effective counting. In this example, the circuit structure is realized by using conventional components, so that the cost can be saved and the circuit structure can be simplified.

Figure 8:
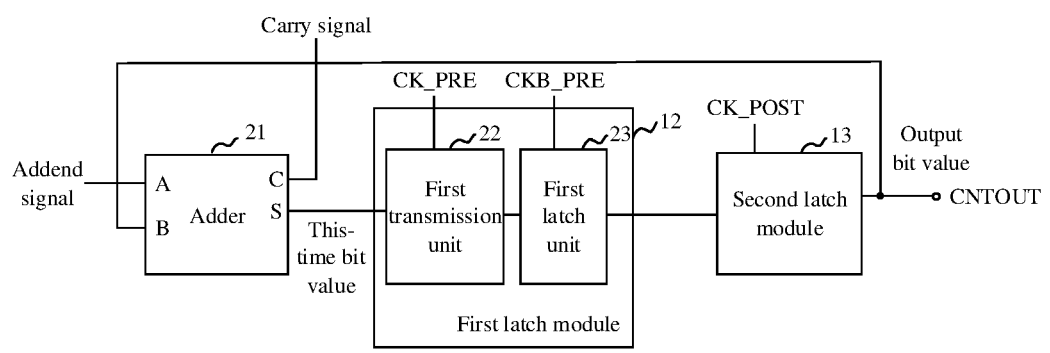
FIG. 8 illustrates a third schematic structural diagram of a counting circuit according to an embodiment of the present disclosure.

In some embodiments, as illustrated in FIG. 8, FIG. 8 illustrates a schematic structural diagram of a counting circuit according to an embodiment of the present disclosure. On the basis of the foregoing, the first latch circuit 12 includes a first transmission circuit 22 and a first latch 23.

The first transmission circuit 22 is connected to the calculation circuit 11 and the first latch 23, and a control terminal of the first transmission circuit 22 is connected to the first clock CK_PRE so as to conduct transmission in response to the arrival of the first clock CK_PRE and to disconnect the transmission in response to the end of the first clock CK_PRE.

The first latch 23 is connected to the second latch circuit 13, and a control terminal of the first latch 23 is connected to an inverted signal CKB_PRE of the first clock CK_PRE so as to output the this-time bit value to the second latch circuit 13 in response to the arrival of the first clock CK_PRE, and to latch the this-time bit value in response to the end of the first clock CK_PRE.

Specifically, the first latch circuit 12 transmits the this-time bit value to the second latch circuit 13 in response to the arrival of the first clock, and latches the this-time bit value at the end of the first clock. Combined with FIGS. 8 and 4, when the first clock CK_PRE arrives (i.e., when the first clock CK_PRE is flipped to a high level), the first transmission circuit 22 conducts the transmission so that the first transmission circuit 22 transmits the received this-time bit value to the first latch 23. At this time, the inverted signal CKB_PRE of the first clock CK_PRE received by the control terminal of the first latch 23 is at a low level, so the first latch 23 does not switch to the latch function, but plays the function of transmission, that is, transmits the this-time bit value received from the first transmission circuit 22 to the second latch circuit 13. Until the end of the first clock CK_PRE (i.e. when the first clock CK_PRE is flipped to a low level), the first transmission circuit 22 disconnects the transmission to prevent the prepared state of the next time of counting obtained by the calculation circuit from affecting the accuracy of the this-time bit value. At the same time, the inverted signal CKB_PRE of the first clock CK_PRE is flipped to a high level, and the first latch 23 switches from the transmission mode to the latch mode, latches the this-time bit value, and continuously outputs the this-time bit value to the second latch circuit 13; until the first clock arrives again, the first transmission circuit 22 conducts the transmission again to update the latched bit value, to realize the accurate counting. In practical applications, the first transmission circuit and the first latch can be implemented in various manners.

Figure 9:
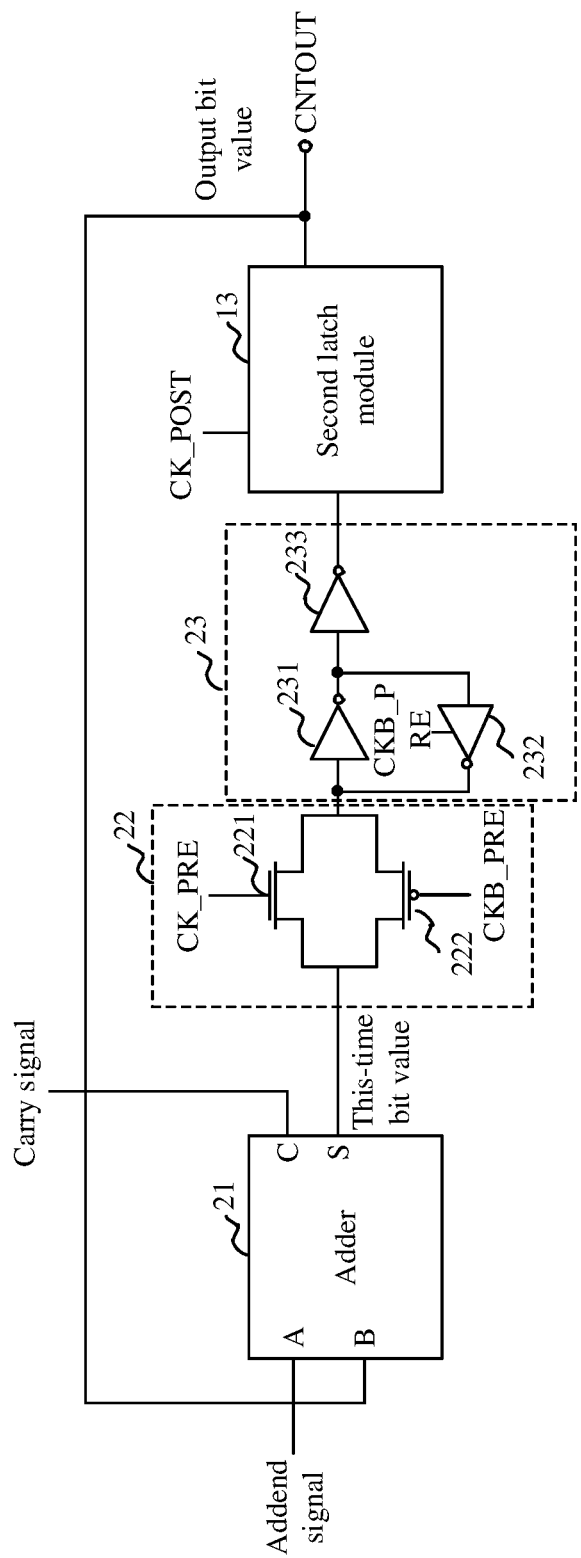
FIG. 9 illustrates a fourth schematic structural diagram of a counting circuit according to an embodiment of the present disclosure.

In an example, as illustrated in FIG. 9, FIG. 9 illustrates a schematic structural diagram of a counting circuit according to an embodiment of the present disclosure. The first transmission circuit includes a first transistor 221 and a second transistor 222.

A first terminal of the first transistor 221 is connected to a first terminal of the second transistor 222, and a second terminal of the first transistor 221 is connected to a second terminal of the second transistor 222.

A control terminal of the first transistor 221 is connected to the first clock CK_PRE, and a control terminal of the second transistor 222 is connected to the inverted signal CKB_PRE of the first clock CK_PRE.

The types of the first transistor and the second transistor are not limited. As an example, the first transistor 221 includes a first positive-channel metal oxide semiconductor (PMOS) transistor, and the second transistor 222 includes a first negative-channel metal oxide semiconductor (NMOS) transistor. The first terminal of the first transistor 221 is a source of the first PMOS transistor, the second terminal of the first transistor 221 is a drain of the first PMOS transistor, and the control terminal of the first transistor 221 is a gate of the first PMOS transistor. The first terminal of the second transistor 222 is a drain of the first NMOS transistor, the second terminal of the second transistor 222 is a source of the first NMOS transistor, and the control terminal of the second transistor 222 is a gate of the first NMOS transistor.

In the example, the first transmission circuit is composed of the first transistor and the second transistor, so as to implement accurate and effective counting. In the example, the circuit structure is realized by using conventional components, so that the cost can be saved and the circuit structure can be simplified.

In an example, the first latch includes a first inverter 231, a first tri-state NOT gate 232, and a second inverter 233.

An input terminal of the first inverter 231 is connected to the first transmission circuit 22 and an output terminal of the first tri-state NOT gate 232, and an output terminal of the first inverter 231 is connected to an input terminal of the first tri-state NOT gate 232 and an input terminal of the second inverter 233. A control terminal of the first tri-state NOT gate 232 is connected to the inverted signal CKB_PRE of the first clock CK_PRE.

An output terminal of the second inverter 233 is connected to the second latch circuit 13.

The types and specific structures of the first inverter, the first tri-state NOT gate and the second inverter are not limited. Specifically, when the first clock CK_PRE arrives (i.e., when the first clock CK_PRE is flipped to a high level), the first transmission circuit 22 transmits the received this-time bit value to the first latch 23. At this time, in the first latch 23, the inverted signal CKB_PRE of the first clock CK_PRE received by the control terminal of the first tri-state NOT gate 232 is at a low level, so the first tri-state NOT gate 232 does not operate. At this time, the first latch 23 is equivalent to a serially connected structure composed of the first inverter 231 and the second inverter 233. Through the serially connected structure, the this-time bit value is transmitted to the second latch circuit 13.

When the first clock CK_PRE ends and is flipped to a low level, the first transmission circuit 22 disconnects the transmission. At the same time, the inverted signal CKB_PRE of the first clock CK_PRE is flipped to a high level, the CKB_PRE clock received by the control terminal of the first tri-state NOT gate 232 is flipped to a high level, and the first tri-state NOT gate 232 starts to operate. At this time, the first inverter 231 and the first tri-state NOT gate 232 constitute a latch structure, so the first latch 23 latches the this-time bit value based on the latch structure.

In the example, the first latch is composed of the first inverter, the first tri-state NOT gate and the second inverter, so as to implement accurate and effective counting. In this example, the circuit structure is realized by using conventional components, so that the cost can be saved and the circuit structure can be simplified.

In the embodiment, the first latch circuit includes the first transmission circuit and the first latch, so as to transmit the this-time bit value to the second latch circuit in response to the arrival of the first clock, and to latch the this-time bit value at the end of the first clock, thereby realizing the accurate and effective counting.

Figure 10:
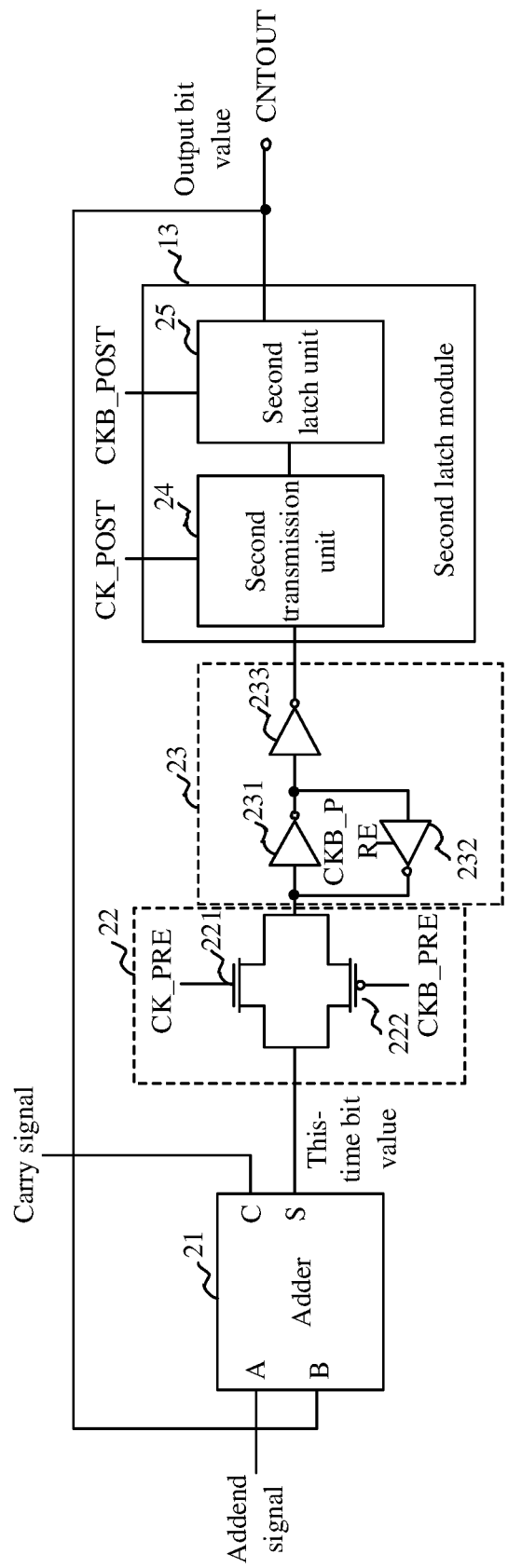
FIG. 10 illustrates a fifth schematic structural diagram of a counting circuit according to an embodiment of the present disclosure.

In some embodiments, as illustrated in FIG. 10, FIG. 10 illustrates a schematic structural diagram of a counting circuit according to an embodiment of the present disclosure. On the basis of the foregoing, the second latch circuit 13 includes a second transmission circuit 24 and a second latch 25.

The second transmission circuit 24 is connected to the first latch circuit 12 and the second latch 25, and a control terminal of the second transmission circuit 24 is connected to the second clock CK_POST so as to conduct transmission in response to the arrival of the second clock CK_POST, and to disconnect the transmission in response to the end of the second clock CK_POST.

The second latch 25 is connected to the second transmission circuit 24 and the calculation circuit 11, and a control terminal of the second latch 25 is connected to an inverted signal CKB_POST of the second clock CK_POST so as to output the this-time bit value to the output terminal CNTOUT of the stage of counting circuit in response to the arrival of the second clock CK_POST, and to latch the this-time bit value in response to the end of the second clock CK_POST.

Specifically, the second latch circuit outputs the this-time bit value to the output terminal of the counting circuit in response to the arrival of the second clock, and latches the this-time bit value in response to the end of the second clock. Combining FIGS. 10 and 4, when the second clock CK_POST arrives, i.e., when the second clock CK_POST is flipped to a high level, the second transmission circuit 24 conducts the transmission. Therefore, the second transmission circuit 24 transmits the received this-time bit value to the second latch 25. At this time, the inverted signal CKB_POST of the second clock CK_POST received by the control terminal of the second latch 25 is at a low level, so the second latch 25 does not switch to the latch function, but plays the function of transmission, that is, transmits the this-time bit value received from the second transmission circuit 24 to the output terminal CNTOUT of the counting circuit. Until the end of the second clock CK_POST, i.e. when the second clock CK_POST is flipped to a low level, the second transmission circuit 24 disconnects the transmission. At the same time, the inverted signal CKB_POST of the second clock CK_POST is flipped to a high level, and the second latch 25 switches from the transmission mode to the latch mode, latches the this-time bit value, and continuously outputs the this-time bit value to the output terminal CNTOUT. Until the first clock arrives again, each circuit executes operations similar to the foregoing to realize the accumulative update of the counting, thus realizing the accurate counting. In practical applications, the second transmission circuit and the second latch can be implemented in various manners.

Figure 11:
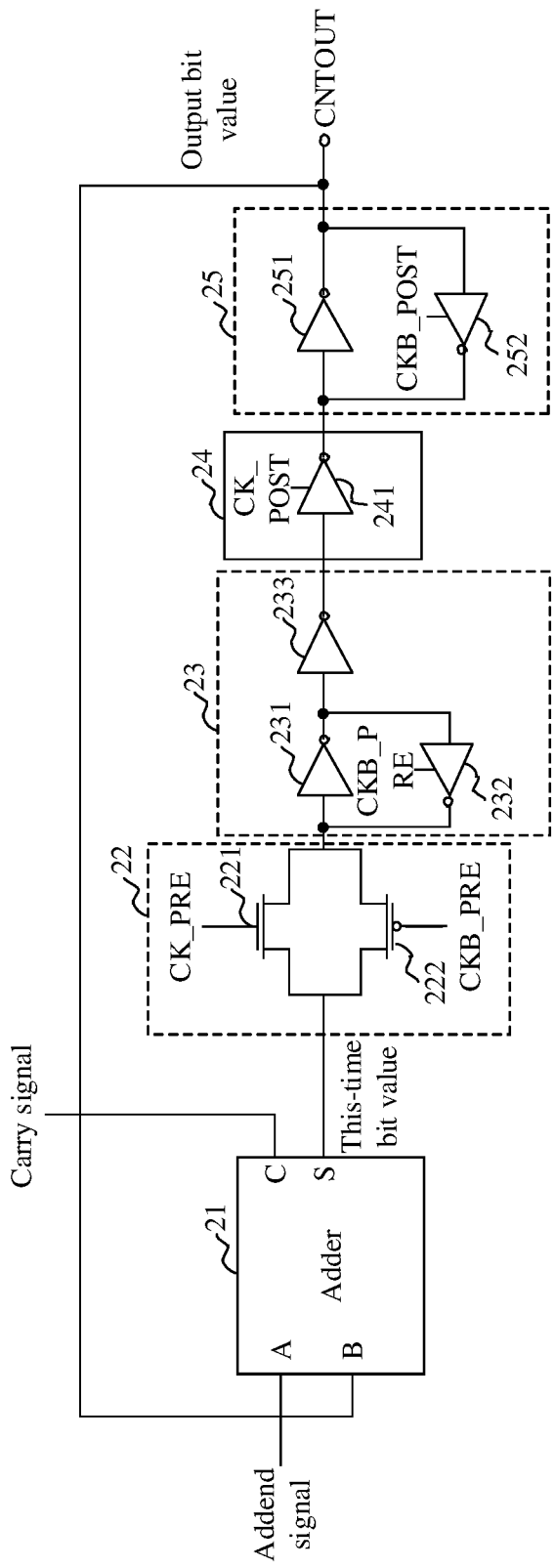
FIG. 11 illustrates a sixth schematic structural diagram of a counting circuit according to an embodiment of the present disclosure.

In an example, as illustrated in FIG. 11, FIG. 11 illustrates a schematic structural diagram of a counting circuit according to an embodiment of the present disclosure. As illustrated in FIG. 11, the second transmission circuit 24 includes a second tri-state NOT gate 241.

An input terminal of the second tri-state NOT gate 241 is connected to the first latch circuit, an output terminal of the second tri-state NOT gate 241 is connected to the second latch 25, and a control terminal of the second tri-state NOT gate 241 is connected to the second clock CK_POST.

The type and specific structure of the second tri-state NOT gate are not limited. In the example, the second transmission circuit is composed of the second tri-state NOT gate, so as to implement accurate and effective counting. In this example, the circuit structure is realized by using conventional components, so that the cost can be saved and the circuit structure can be simplified.

In an example, the second latch 25 includes a third inverter 251 and a third tri-state NOT gate 252.

An input terminal of the third inverter 251 is connected to the second transmission circuit 24 and an output terminal of the third tri-state NOT gate 252, and an output terminal of the third inverter 251 is connected to an input terminal of the third tri-state NOT gate 252 and the output terminal of the counting circuit CNTOUT.

A control terminal of the third tri-state NOT gate 252 serves as the control terminal of the second latch 25, and is connected to the inverted signal CKB_POST of the second clock CK_POST.

The types and specific structures of the third inverter and the third tri-state NOT gate are not limited. Specifically, when the second clock CK_POST arrives, i.e., when the second clock CK_POST is flipped to a high level, the second transmission circuit 24 transmits the received this-time bit value to the second latch 25. At this time, in the second latch 25, the inverted signal CKB_POST of the second clock CK_POST received by the control terminal of the third tri-state NOT gate 252 is at a low level, so the third tri-state NOT gate 252 does not operate. At this time, the second latch 25 is equivalent to a serially connected structure composed of the third inverter 251 and the second inverter 233. Through the serially connected structure, the this-time bit value is transmitted to the output terminal of the counting circuit.

When the second clock CK_POST ends and is flipped to a low level, the second transmission circuit 24 disconnects the transmission. At the same time, the inverted signal CKB_POST of the second clock CK_POST is flipped to a high level, the CKB_POST clock received by the control terminal of the third tri-state NOT gate 252 is flipped to a high level, and the third tri-state NOT gate 252 starts to operate. At this time, the third inverter 251 and the third tri-state NOT gate 252 constitute a latch structure, so the second latch 25 latches the this-time bit value based on the latch structure.

In the example, the second latch is composed of the third inverter and the third tri-state NOT gate, so as to implement accurate and effective counting. In this example, the circuit structure is realized by using conventional components, so that the cost can be saved and the circuit structure can be simplified.

In the embodiment, the second latch circuit includes the second transmission circuit and the second latch, so as to output the this-time bit value to the output terminal of the counting circuit in response to the arrival of the second clock, and to latch the this-time bit value at the end of the second clock, thereby realizing the accurate and effective counting.

Figure 12:
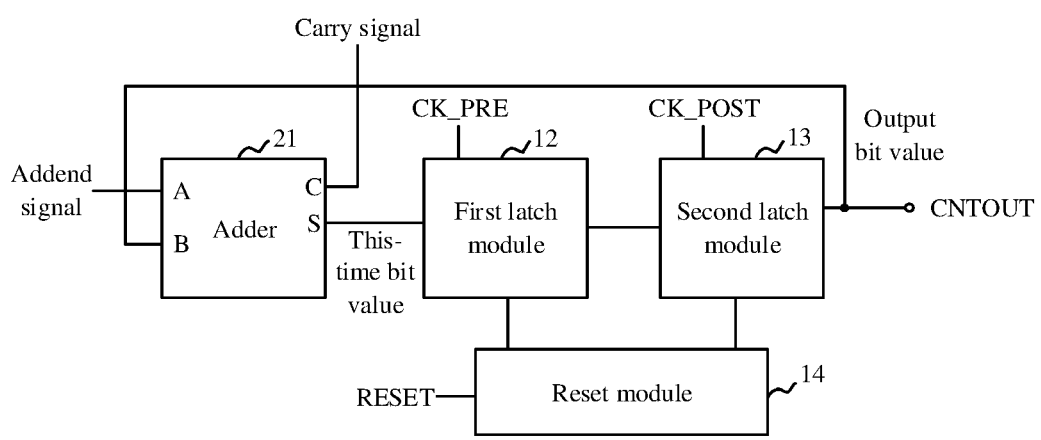
FIG. 12 illustrates a seventh schematic structural diagram of a counting circuit according to an embodiment of the present disclosure.

In view of the case that the counting is cleared, a reset function can be set for the counter circuit. In some embodiments, FIG. 12 illustrates a schematic structural diagram of a counting circuit according to an embodiment of the present disclosure. As illustrated in FIG. 12, each stage of counting circuit further includes a reset circuit 14.

The reset circuit 14 is connected to the first latch circuit 12 and the second latch circuit 13, and a control terminal of the reset circuit 14 is connected to a reset signal RESET.

The reset circuit 14 is configured to reset the first latch circuit 12 and the second latch circuit 13 in response to the reset signal RESET.

Figure 13:
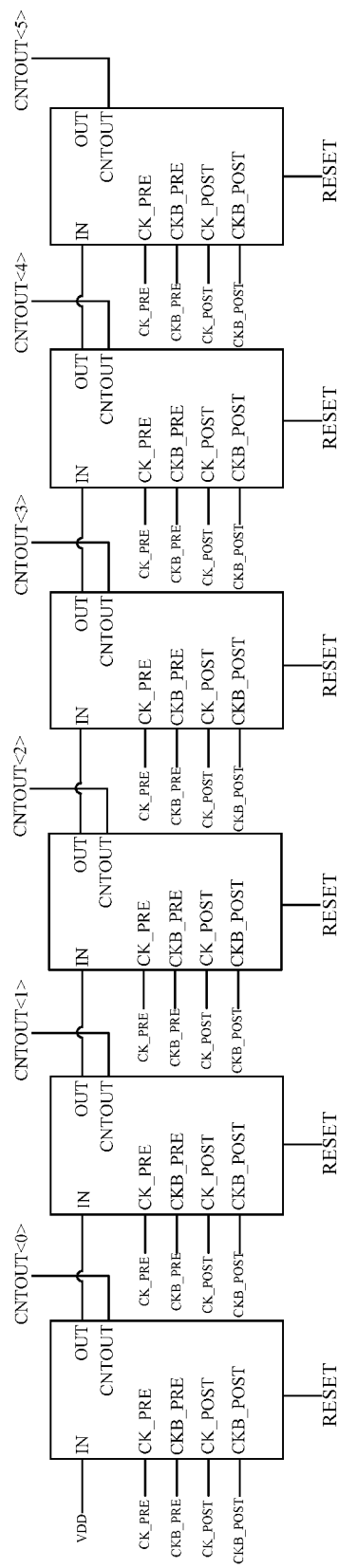
FIG. 13 illustrates a schematic structural diagram of a counter circuit according to an embodiment of the present disclosure.

In practical applications, an overall architecture of the counter circuit supporting the reset function is as illustrated in FIG. 13. FIG. 13 illustrates a schematic structural diagram of a counter circuit according to an embodiment of the present disclosure. That is, each counting circuit has a reset port RESET, and these reset ports RESET are connected to the reset signal RESET. In an example, the reset circuit 14 clears the bit values in the first latch circuit 12 and the second latch circuit 13 in response to the reset signal.

Additionally, as an example, the counting circuit further comprises input ports for the inverted signal of the clock signal, such as, CKB_PRE and CKB_POST ports. It should be noted that the foregoing examples or embodiments may be implemented alone or in combination, and the drawings merely illustrate situations where some examples or embodiments are implemented in combination, and do not limit other possible implementations.

Figure 14:
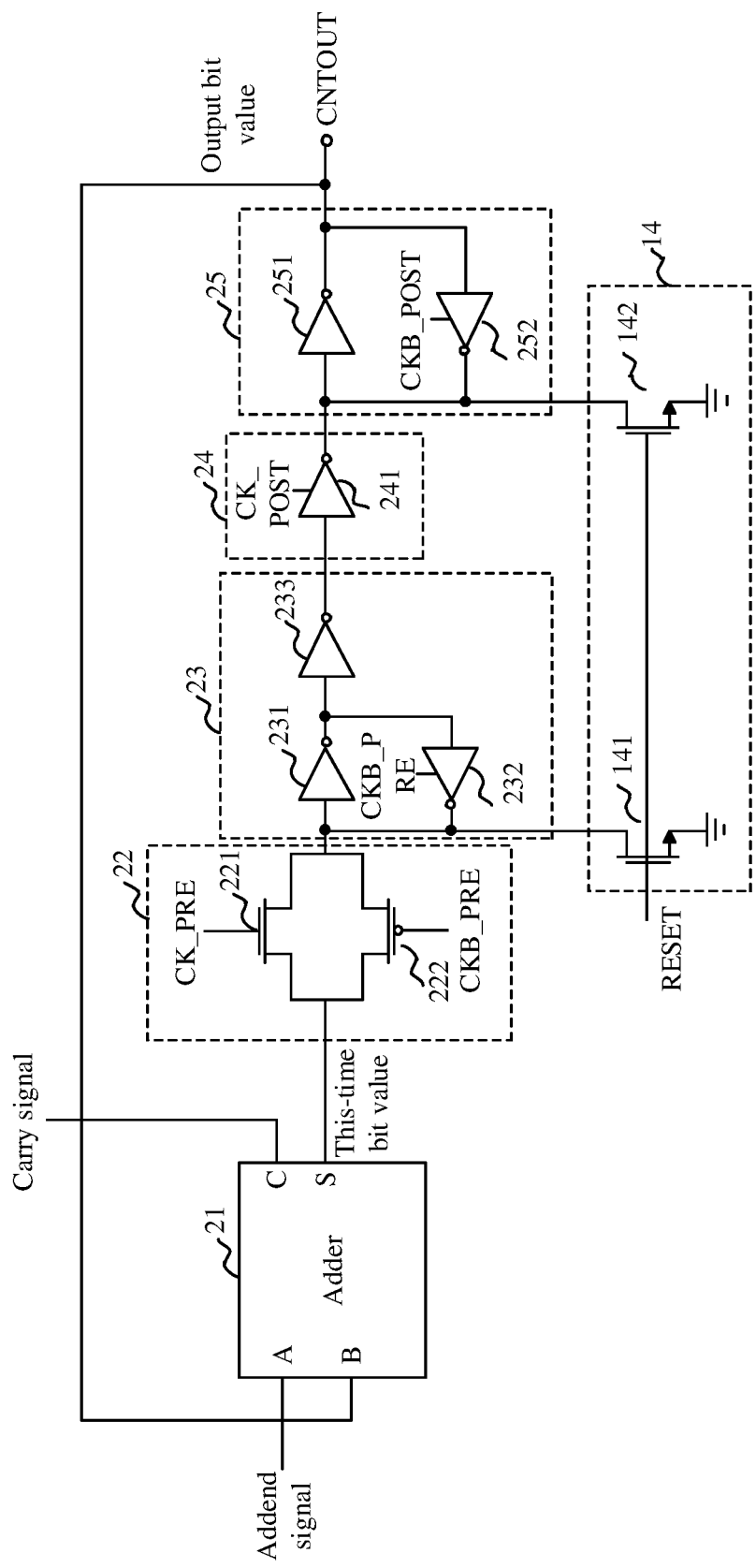
FIG. 14 illustrates a schematic structural diagram of a counting circuit according to an embodiment of the present disclosure.

As an example, FIG. 14 illustrates a schematic structural diagram of a counting circuit according to an embodiment of the present disclosure. Based on the foregoing, the reset circuit 14 includes a first reset switch 141 corresponding to the first latch circuit and a second reset switch 142 corresponding to the second latch circuit.

A first terminal of the first reset switch 141 is connected to the first latch circuit, a second terminal of the first reset switch 141 is grounded, and a control terminal of the first reset switch 141 is connected to the reset signal RESET.

A first terminal of the second reset switch 142 is connected to the second latch circuit, a second terminal of the second reset switch 142 is grounded, and a control terminal of the second reset switch 142 is connected to the reset signal RESET.

The types of the first reset switch and the second reset switch may not be limited. For example, the first reset switch 141 includes a second negative-channel metal oxide semiconductor (NMOS) transistor, and the second reset switch 142 includes a third NMOS transistor.

The first terminal of the first reset switch 141 is a drain of the second NMOS transistor, the second terminal of the first reset switch 141 is a source of the second NMOS transistor, and the control terminal of the first reset switch 141 is a gate of the second NMOS transistor.

The first terminal of the second reset switch 142 is a drain of the third NMOS transistor, the second terminal of the second reset switch 142 is a source of the third NMOS transistor, and the control terminal of the second reset switch 142 is a gate of the third NMOS transistor.

Specifically, when the counter circuit counts normally, the reset signal RESET is in an inactive state. For example, if the reset signal is active at a high level, the reset signal RESET is at a low level at this time. Both the second NMOS transistor and the third NMOS transistor are disconnected, and the first latch circuit 12 and the second latch circuit 13 work normally. When reset is needed, the reset signal RESET is flipped to a high level, correspondingly, the second NMOS transistor and the third NMOS transistor are turned on, and the correspondingly connected nodes in the first latch circuit 12 and the second latch circuit 13 are pulled down to the ground, that is, pulled down to 0. Furthermore, the output of each stage of counting circuit is 0, so that the counting result CNTOUT<5:0> output by the counter circuit is reset to 000000 to realize clearing.

In the embodiment, by providing the reset circuit, the reset of the counter circuit can be realized, thereby enriching the functions of the counter circuit and further meeting the counting requirements under different situations.

Figure 15:
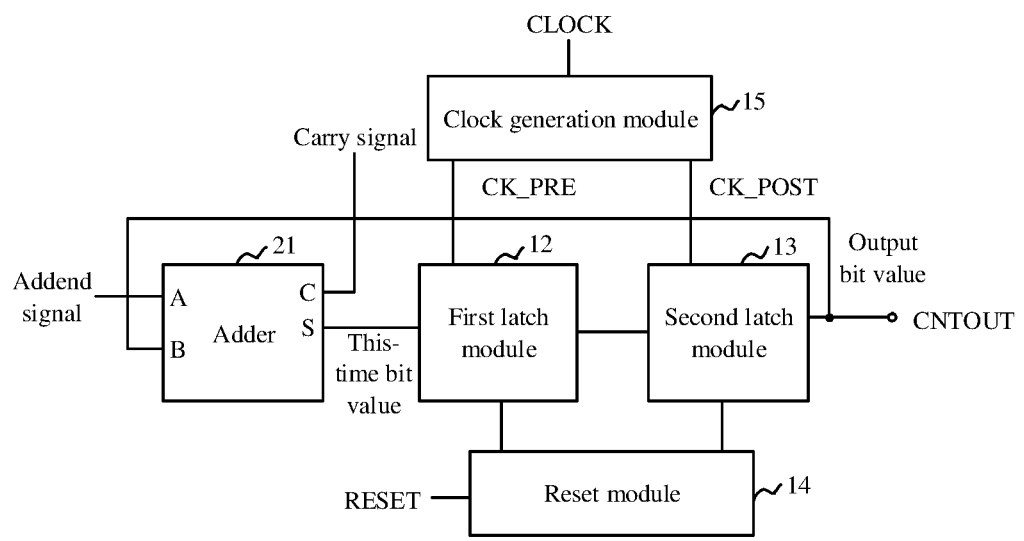
FIG. 15 illustrates a schematic structural diagram of a counter circuit according to an embodiment of the present disclosure.

In addition, in order to provide the first clock and the second clock, an example is shown in FIG. 15. FIG. 15 illustrates a schematic structural diagram of a counter circuit according to an embodiment of the present disclosure. On the basis of any of the foregoing examples, the counter circuit further includes a clock generator 15.

The clock generator 15 is configured to divide the system clock CLOCK to generate the first clock CK_PRE and the second clock CK_POST. A rising edge of the first clock CK_PRE is aligned with a rising edge of the system clock CLOCK, a falling edge of the first clock CK_PRE is aligned with a rising edge of the second clock CK_POST, and a falling edge of the second clock CK_POST is aligned with a falling edge of the system clock CLOCK.

Specifically, the clock generator divides the effective level part of the system clock to obtain two clocks, namely, the first clock and the second clock. As an example, reference may be made to the timing diagrams of the system clock, the first clock and the second clock shown in FIG. 4. It should be noted that in practical applications, factors such as transmission delay of signals in the path are considered, and the clock error is considered in "align" here. Therefore, even if there is deviation, it is still within the allowable error range, which is also considered to be aligned.

Figure 16:
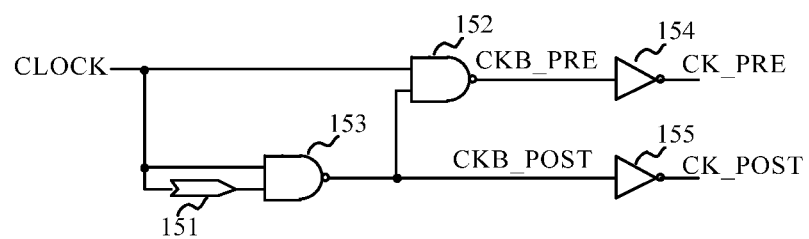
FIG. 16 illustrates a schematic structural diagram of a clock generator according to an embodiment of the present disclosure.

The specific structure of the clock generator is not limited. In one example, as illustrated in FIG. 16. FIG. 16 illustrates a schematic structural diagram of a clock generator according to an embodiment of the present disclosure. The clock generator 15 includes a delay 151, a first NAND gate 152, a second NAND gate 153, a fourth inverter 154, and a fifth inverter 155.

A first input terminal of the first NAND gate 152 is connected to the system clock CLOCK, a second input terminal of the first NAND gate 152 is connected to an output terminal of the second NAND gate 153, and an output terminal of the first NAND gate 152 is connected to an input terminal of the fourth inverter 154.

A first input terminal of the second NAND gate 153 is connected to the system clock, a second input terminal of the second NAND gate 153 is connected to an output terminal of the delay 151, and the output terminal of the second NAND gate 153 is connected to an input terminal of the fifth inverter 155.

An input terminal of the delay 151 is connected to the system clock CLOCK. An output terminal of the fourth inverter 154 is configured to output the first clock CK_PRE. An output terminal of the fifth inverter 155 is configured to output the second clock CK_POST.

In this example, the clock generator is composed of the delay, the first NAND gate, the second NAND gate, the fourth inverter and the fifth inverter, so as to implement the division of the system clock, and to provide the first clock and the second clock to support the accurate and effective counting. In this example, the circuit structure is realized by using conventional components, so that the cost can be saved and the circuit structure can be simplified.

The counter circuit provided by the embodiment includes multiple stages of counting circuits corresponding to binary bits. Each stage of counting circuit is configured to: obtain a carry signal and a this-time bit value according to an addend signal and a bit value currently output by the stage of counting circuit, output the carry signal to a next-stage counting circuit, latch the this-time bit value in response to a first clock, and output the this-time bit value to an output terminal of the stage of counting circuit in response to a second clock. An output of the counter circuit is composed of bit values output by the multiple stages of counting circuits, and the output is a binary representation of a counting result. The first clock and the second clock are obtained based on division of a system clock. In the above scheme, the counter circuit is composed of the multiple stages of counting circuits each of which executes the addition processing of the present stage, and latches the bit value of the previous time of counting in response to the first clock, and the output results of the multiple stages of counting circuits constitute the binary representation of the whole counting result. Thus, the counting function can be realized. The aforementioned counter circuit can be realized by using an adder without relying on flip-flops to implement counting, thereby improving the design flexibility of the counter circuit.

Other embodiments of the present disclosure will readily occur to those skilled in the art upon consideration of the description and practice of the invention disclosed herein. The present disclosure is intended to cover any variations, uses, or adaptations of the present disclosure that follow the general principles of the present disclosure and include common sense or conventional techniques in the art not disclosed herein. The description and embodiments are to be considered exemplary only and the true scope and spirit of the present disclosure are indicated by the appended claims.

It should be understood that the present disclosure is not limited to the precise structure described above and shown in the drawings, and various modifications and changes may be made without departing from the scope thereof. The scope of the present disclosure is limited only by the appended claims.

What is claimed is:

1. A counter circuit, comprising multiple stages of counting circuits corresponding to binary bits, wherein each stage of counting circuit is configured to:
   obtain a carry signal and a this-time bit value according to an addend signal and a bit value that is currently output by the stage of counting circuit,
   output the carry signal to a next-stage counting circuit,
   latch the this-time bit value in response to a first clock, and
   output the this-time bit value to an output terminal of the stage of counting circuit in response to a second clock;
   wherein bit values output by the multiple stages of counting circuits compose an output of the counter circuit, and the output is a binary representation of a counting result;
   an addend signal of a start-stage counting circuit is a high-level signal, and an addend signal of a non-start-stage counting circuit is a carry signal output by an immediately previous stage of counting circuit; and
   the first clock and the second clock are obtained based on division of a system clock.

2. The counter circuit of claim 1, wherein each stage of counting circuit comprises: a calculation circuit, a first latch circuit and a second latch circuit; and
   the calculation circuit is connected to the second latch circuit and a calculation circuit of the next-stage counting circuit, and is configured to: obtain the carry signal and the this-time bit value according to the addend signal and the bit value that is currently output by the second latch circuit, and output the carry signal to the calculation circuit of the next-stage counting circuit;
   the first latch circuit is connected to the calculation circuit and the second latch circuit, and is configured to: transmit the this-time bit value to the second latch circuit in response to arrival of the first clock, and latch the this-time bit value in response to end of the first clock; and
   the second latch circuit is configured to: output the this-time bit value to the output terminal of the stage of counting circuit in response to arrival of the second clock, and latch the this-time bit value in response to end of the second clock.

3. The counter circuit of claim 2, wherein the calculation circuit comprises an adder; and
   a first input terminal of the adder is connected to the addend signal, and a second input terminal of the adder is connected to an output terminal of the second latch circuit; and
   a carry terminal of the adder is connected to the next-stage counting circuit, and a sum terminal of the adder is connected to the first latch circuit and is configured to output the this-time bit value.

4. The counter circuit of claim 2, wherein the first latch circuit comprises a first transmission circuit and a first latch;
   the first transmission circuit is connected to the calculation circuit and the first latch, and a control terminal of the first transmission circuit is connected to the first clock so as to conduct transmission in response to the arrival of the first clock, and to disconnect the transmission in response to the end of the first clock; and
   the first latch is connected to the second latch circuit, and a control terminal of the first latch is connected to an inverted signal of the first clock so as to output the this-time bit value to the second latch circuit in response to the arrival of the first clock, and to latch the this-time bit value in response to the end of the first clock.

5. The counter circuit of claim 4, wherein the first transmission circuit comprises a first transistor and a second transistor;
   a first terminal of the first transistor is connected to a first terminal of the second transistor, and a second terminal of the first transistor is connected to a second terminal of the second transistor; and
   a control terminal of the first transistor is connected to the first clock, and a control terminal of the second transistor is connected to the inverted signal of the first clock.

6. The counter circuit of claim 5, wherein the first transistor comprises a first positive-channel metal oxide semiconductor (PMOS) transistor, and the second transistor comprises a first negative-channel metal oxide semiconductor (NMOS) transistor;
   the first terminal of the first transistor is a source of the first PMOS transistor, the second terminal of the first transistor is a drain of the first PMOS transistor, and the control terminal of the first transistor is a gate of the first PMOS transistor; and
   the first terminal of the second transistor is a drain of the first NMOS transistor, the second terminal of the second transistor is a source of the first NMOS transistor, and the control terminal of the second transistor is a gate of the first NMOS transistor.

7. The counter circuit of claim 4, wherein the first latch comprises a first inverter, a first tri-state NOT gate, and a second inverter;
   an input terminal of the first inverter is connected to the first transmission circuit and an output terminal of the first tri-state NOT gate, and an output terminal of the first inverter is connected to an input terminal of the first tri-state NOT gate and an input terminal of the second inverter; and a control terminal of the first tri-state NOT gate is connected to the inverted signal of the first clock; and
   an output terminal of the second inverter is connected to the second latch circuit.

8. The counter circuit of claim 2, wherein the second latch circuit comprises a second transmission circuit and a second latch;
   the second transmission circuit is connected to the first latch circuit and the second latch, and a control terminal of the second transmission circuit is connected to the second clock so as to conduct transmission in response to the arrival of the second clock, and to disconnect the transmission in response to the end of the second clock; and the second latch is connected to the second transmission circuit and the calculation circuit, and a control terminal of the second latch is connected to an inverted signal of the second clock so as to output the this-time bit value to the output terminal of the stage of counting circuit in response to the arrival of the second clock, and to latch the this-time bit value in response to the end of the second clock.

9. The counter circuit of claim 8, wherein the second transmission circuit comprises a second tri-state NOT gate; and an input terminal of the second tri-state NOT gate is connected to the first latch circuit, an output terminal of the second tri-state NOT gate is connected to the second latch, and a control terminal of the second tri-state NOT gate is connected to the second clock.

10. The counter circuit of claim 8, wherein the second latch comprises a third inverter and a third tri-state NOT gate;

an input terminal of the third inverter is connected to the second transmission circuit and an output terminal of the third tri-state NOT gate, and an output terminal of the third inverter is connected to an input terminal of the third tri-state NOT gate and the output terminal of the stage of counting circuit; and a control terminal of the third tri-state NOT gate serves as the control terminal of the second latch and is connected to the inverted signal of the second clock.

11. The counter circuit of claim 2, wherein each stage of counting circuit further comprises a reset circuit;

the reset circuit is connected to the first latch circuit and the second latch circuit, and a control terminal of the reset circuit is connected to a reset signal; and the reset circuit is configured to reset the first latch circuit and the second latch circuit in response to the reset signal.

12. The counter circuit of claim 11, wherein the reset circuit comprises: a first reset switch corresponding to the first latch circuit, and a second reset switch corresponding to the second latch circuit;

a first terminal of the first reset switch is connected to the first latch circuit, a second terminal of the first reset switch is grounded, and a control terminal of the first reset switch is connected to the reset signal; and a first terminal of the second reset switch is connected to the second latch circuit, a second terminal of the second reset switch is grounded, and a control terminal of the second reset switch is connected to the reset signal.

13. The counter circuit of claim 12, wherein the first reset switch comprises a second negative-channel metal oxide semiconductor (NMOS) transistor, and the second reset switch comprises a third NMOS transistor;

the first terminal of the first reset switch is a drain of the second NMOS transistor, the second terminal of the first reset switch is a source of the second NMOS transistor, and the control terminal of the first reset switch is a gate of the second NMOS transistor; and the first terminal of the second reset switch is a drain of the third NMOS transistor, the second terminal of the second reset switch is a source of the third NMOS transistor, and the control terminal of the second reset switch is a gate of the third NMOS transistor.

14. The counter circuit of claim 1, further comprising a clock generator, configured to:

divide the system clock to generate the first clock and the second clock, wherein a rising edge of the first clock is aligned with a rising edge of the system clock, a falling edge of the first clock is aligned with a rising edge of the second clock, and a falling edge of the second clock is aligned with a falling edge of the system clock.

15. The counter circuit of claim 14, wherein the clock generator comprises a delay, a first NAND gate, a second NAND gate, a fourth inverter, and a fifth inverter;

a first input terminal of the first NAND gate is connected to the system clock, a second input terminal of the first NAND gate is connected to an output terminal of the second NAND gate, and an output terminal of the first NAND gate is connected to an input terminal of the fourth inverter;

a first input terminal of the second NAND gate is connected to the system clock, a second input terminal of the second NAND gate is connected to an output terminal of the delay, and the output terminal of the second NAND gate is connected to an input terminal of the fifth inverter;

an input terminal of the delay is connected to the system clock;

an output terminal of the fourth inverter is configured to output the first clock; and an output terminal of the fifth inverter is configured to output the second clock.

* * * * *